(12) United States Patent
Neyret et al.

(10) Patent No.: US 6,962,858 B2
(45) Date of Patent: Nov. 8, 2005

(54) METHOD FOR REDUCING FREE SURFACE ROUGHNESS OF A SEMICONDUCTOR WAFER

(75) Inventors: Eric Neyret, Sassenage (FR); Ludovic Ecarnot, Varces (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/750,443

(22) Filed: Dec. 30, 2003

(65) Prior Publication Data

US 2004/0171257 A1 Sep. 2, 2004

Related U.S. Application Data

(63) Continuation of application No. PCT/FR02/02341, filed on Jul. 4, 2002.

(30) Foreign Application Priority Data

Jul. 4, 2001 (FR) .................................. 0108859

(51) Int. Cl.[7] .......................................... H01L 21/322
(52) U.S. Cl. .................... 438/471; 438/715; 438/799
(58) Field of Search ............................... 438/471, 480, 438/510, 519, 766, 787, 788, 795, 765, 715, 438/799

(56) References Cited

U.S. PATENT DOCUMENTS

| 5,374,564 | A |   | 12/1994 | Bruel ............................ 437/24 |
| 5,403,406 | A | * | 4/1995  | Falster et al. ............... 148/33.2 |
| 5,738,909 | A | * | 4/1998  | Thakur et al. ............ 427/255.4 |
| 5,856,027 | A | * | 1/1999  | Murphy ...................... 428/623 |
| 5,966,625 | A | * | 10/1999 | Zhong et al. ............... 438/492 |
| 6,171,965 | B1 |  | 1/2001  | Kang et al. ................. 438/695 |
| 6,403,450 | B1 |  | 6/2002  | Maleville et al. ........... 438/471 |
| 6,573,159 | B1 |  | 6/2003  | Kobayashi et al. ......... 438/471 |
| 6,577,386 | B2 | * | 6/2003  | Yoshida et al. ............. 356/123 |
| 6,589,609 | B1 | * | 7/2003  | Pan et al. .................... 427/554 |
| 6,680,260 | B2 | * | 1/2004  | Akiyama et al. ........... 438/766 |
| 6,809,015 | B2 | * | 10/2004 | Kobayashi et al. ......... 438/540 |

FOREIGN PATENT DOCUMENTS

| EP | 1045448 | 10/2000 |
| EP | 1061565 | 12/2000 |
| EP | 1158581 | 11/2001 |
| FR | 2777115 | 10/1999 |
| FR | 2797713 | 2/2001 |
| WO | WO 01/15215 | 3/2001 |
| WO | WO 01/28000 | 4/2001 |

* cited by examiner

*Primary Examiner*—Phuc T. Dang
(74) *Attorney, Agent, or Firm*—Winston & Strawn LLP

(57) ABSTRACT

The invention provides a method of reducing the roughness of the free surface of a wafer of semiconductor material by applying a rapid thermal annealing process under a pure argon atmosphere for a time sufficient to uniformly heat and smooth the free surface of the wafer.

26 Claims, 1 Drawing Sheet

METHOD FOR REDUCING FREE SURFACE ROUGHNESS OF A SEMICONDUCTOR WAFER

CROSS-REFERENCE TO RELATED APPLICATIONS

This application is a continuation of International application PCT/FR02/02341 filed Jul. 4, 2002, the entire content of which is expressly incorporated herein by reference thereto.

BACKGROUND ART

The present invention generally relates to the surface treatment of semiconductor materials, and in particular to treating substrates for fabricating components for microelectronic and/or optoelectronic applications. More precisely, the invention concerns a method of reducing the roughness of the free surface of a semiconductor wafer that includes an annealing step to smooth the free surface.

The term "free surface" means the surface of a wafer which is exposed to the external environment (in contrast to an interface surface which is in contact with the surface of another wafer or some other element).

As explained below, the invention can be implemented in a particularly advantageous, but non-limiting manner, in combination with a method of fabricating thin films or layers of semiconductor material of the type described in U.S. Pat. No. 5,374,564. A method that uses the teaching of the above-cited document is known as the SMART-CUT® method. In outline, its main steps are as follows: implanting atoms beneath a face of a semiconductor substrate (in particular silicon), in an implantation zone of the substrate, bonding the implanted substrate onto a stiffener substrate by intimate contact, and detaching the implanted substrate in its implantation zone, or zone of weakness, to transfer the portion of the substrate that is situated between the surface that was subjected to implantation and the implantation zone to the stiffener, to form a thin film or semiconductor layer thereon.

The term "implanting" atoms means any bombardment of atomic or ionic species suitable for introducing the species into the material of the wafer, with the implanted species having a concentration maximum at a predetermined depth within the wafer relative to the bombarded surface, so as to define a zone of weakness. The depth of the zone of weakness is a function of the nature of the implanted species, and the implantation energy associated therewith. In this text, the generic term "wafer" may be used to designate the film or layer transferred by such a SMART-CUT® type method. The wafer (which is made of semiconductor material) can thus be associated with a stiffener, and possibly also with other intermediate layers.

The term "wafer" is also used in the present text to mean any wafer, layer, or film of semiconductor material such as silicon, regardless of whether or not the wafer has been produced by a SMART-CUT® type method, the object being in all cases to reduce the roughness of the free surface of the wafer. For applications of the type mentioned above, the roughness specifications associated with the free surfaces of wafers are very severe and critical, and the quality of the wafer free surface is a parameter which determines the quality of components to be made on the wafer. It is thus common to find roughness specifications that must not exceed 5 angstroms (Å) in root mean square (rms) value.

Roughness measurements are generally performed using an atomic force microscope (AFM). Roughness is measured on surfaces that are scanned by the tip of the AFM microscope, covering areas in the range 1 micrometer ($\mu$m)×1 $\mu$m to 10 $\mu$m×10 $\mu$m, and sometimes 50 $\mu$m×50 $\mu$m, or even 100 $\mu$m×100 $\mu$m.

Roughness may be characterized in two ways. First, the roughness can be described as a "high frequency" roughness and corresponds to scanning areas of about 1 $\mu$m×1 $\mu$m. Second, the roughness is a "low frequency" roughness when scanning corresponds to scanning areas of about 10 $\mu$m×10 $\mu$m or greater. The 5 Å specification example given above is thus for roughness corresponding to a scan area of 10 $\mu$m×10 $\mu$m.

Wafers produced by known methods (such as the SMART-CUT® type or other layer detachment methods) present surface roughnesses of values that are greater than the specifications of the magnitude specified above, unless the surface of the wafer is subjected to a specific treatment, such as polishing. A first known method for reducing the surface roughness of wafers consists of subjecting the wafer to "conventional" heat treatment (e.g. sacrificial oxidation). However, such treatment does not decrease the roughness of wafers down to the level of the above-mentioned specifications. In order to further reduce roughness, it is possible to envisage increasing the number of applications of conventional heat treatments, and/or combining them with other known methods. But such techniques lead to a method that is lengthy and complex. For example, U.S. Pat. No. 6,573,159 discloses a lengthy annealing process (about 60 minutes (mins)) at high temperature, followed by cooling under an atmosphere containing hydrogen.

A second known method consists of subjecting the free surface of the wafer to chemical-mechanical polishing. This method can indeed reduce the roughness of the free surface of the wafer. However, if a defect concentration gradient that increases towards the free surface of the wafer exists, this second method can also abrade the wafer down to a zone that presents an acceptable concentration of defects. But this second known method can compromise the uniformity of the free surface of the wafer. This drawback is worsened when a large amount of polishing is performed on the surface of the wafer, as would be necessary to reach the roughness levels mentioned above.

A third known method consists of subjecting the wafer to rapid annealing under a controlled atmosphere, known as rapid thermal annealing (RTA). In this text, this form of annealing is referred to either by its acronym RTA or in full as "rapid thermal annealing".

In this third method, the wafer is annealed at high temperature, which may lie in the range of about 1100° C. to 1300° C., for a period of 1 second to 60 seconds. In a first variant of this third type of method, an example of which is to be found in U.S. Pat. No. 6,171,965, the free surface of is smoothed by performing RTA of the wafer under an atmosphere consisting of a mixture generally comprising hydrogen in combination with reagent gases (HCl, HF, HBr, $SF_6$, $CF_4$, $NF_3$, $CCl_2F_2$, etc.). In this first variant of the third method, the aggressive nature of the mixture constituting the annealing atmosphere enables the free surface of the wafer to be "etched", thereby reducing its roughness. Although this first variant can present certain advantages, the aggressive nature of the mixture of gases of the atmosphere limits the use of such a method, and elements other than the free surface of the wafer may be exposed to the action thereof (the face of the wafer or the structure to which it is bonded that faces away from the free surface of the wafer may also be detrimentally affected, and sometimes also the annealing chamber may be detrimentally affected.). It can thus be necessary to take additional measures to protect those elements, which tends to make the method even more complex. The aggressive nature of the mixture that is used can, under some circumstances, also worsen defects in the wafer, resulting in the wafer requiring additional treatments. Furthermore, use of an annealing atmosphere made up of different gases, some of which are reactive, requires providing an installation for implementing such a method that can be relatively complex (feeds for different gases, safety measures and the like).

An implementation taught in U.S. Pat. No. 6,573,159 corresponds to the first variant of the third type of method. In that implementation, RTA is performed in an atmosphere that always contains hydrogen. In a second variant of the third type of method, the wafer is subjected to RTA under an atmosphere that does not attack the material of the wafer. Smoothing results not from etching the free surface of the wafer, but from rebuilding the surface of the wafer. In that case, the annealing atmosphere is typically made up of hydrogen mixed with argon or nitrogen. PCT application WO01/15215 in the name of SOITEC Silicon-On-Insulator Technologies, S.A. discloses an example of the second variant of the third type of method.

PCT application WO01/28000 discloses a finishing treatment that always comprises two annealing operations, including one RTA operation. The annealing operations are performed in an atmosphere containing hydrogen or argon. The two disclosed annealing operations both smooth the free surface of the wafer. The reduction in low frequency roughness is illustrated by the last column of Table 2 in that document, which shows in particular the effect of the second annealing operation following the RTA operation. With RTA treatment alone ("comparative example 1"), low frequency roughness after treatment is in nanometers (nm) rms. By implementing the two annealing operations as described in that document, the low frequency roughness is significantly improved, reaching values of 0.28 nm rms and 0.30 nm rms. The teaching of PCT application WO01/28000 is thus focused on performing two successive operations of smoothing by annealing (where smoothing is characterized by a reduction in low frequency roughness), with the first of those two annealing operations being RTA. However, the method taught by PCT application WO01/28000 is relatively lengthy and expensive to implement since it always requires two annealing operations for smoothing.

The present invention seeks to provide an improvement to the methods mentioned above by simplifying such methods further. In addition, it would also be advantageous to reduce any slip lines that can appear in the crystallographic structure of the material of the wafer, in particular as a result of heat treatment (such as that which might be applied to the wafer in order to detach it when performing a SMART-CUT® type method). It is known that such slip lines can result from heating different regions of the wafer in a non-uniform manner (this is particularly troublesome in furnaces presenting cold spots). Furthermore, hydrogen used in the prior art implementations is a gas that is relatively expensive, and there is a continuous effort to reduce the costs associated with wafer treatment methods. Finally, it would be particularly advantageous to be able to implement a method satisfying the above-mentioned objects in combination with the use of a SMART-CUT® type method.

SUMMARY OF THE INVENTION

Presented is, in a first aspect, a method of reducing the roughness of the free surface of a wafer of semiconductor material. The method includes an annealing stage in order to smooth the free surface, wherein a single smoothing annealing operation in the form of rapid thermal annealing under an atmosphere made up exclusively of pure argon is implemented. The method includes applying a rapid thermal annealing process under a pure argon atmosphere for a time sufficient to uniformly heat and smooth the free surface of the wafer.

Another aspect of the invention relates to a method for reducing roughness of a free surface of a wafer of semiconductor material which comprises placing a wafer into a chamber; introducing an annealing atmosphere of pure argon into the chamber at a predetermined pressure; heating the chamber to increase temperature inside the chamber at a predetermined rate up to a treatment temperature; maintaining the wafer in the chamber at the treatment temperature for a duration of a high-temperature dwell; and cooling the wafer at a rate of several tens of degrees Celsius per second.

The invention also provides silicon on insulator (SOI) structures obtained by such methods.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1:
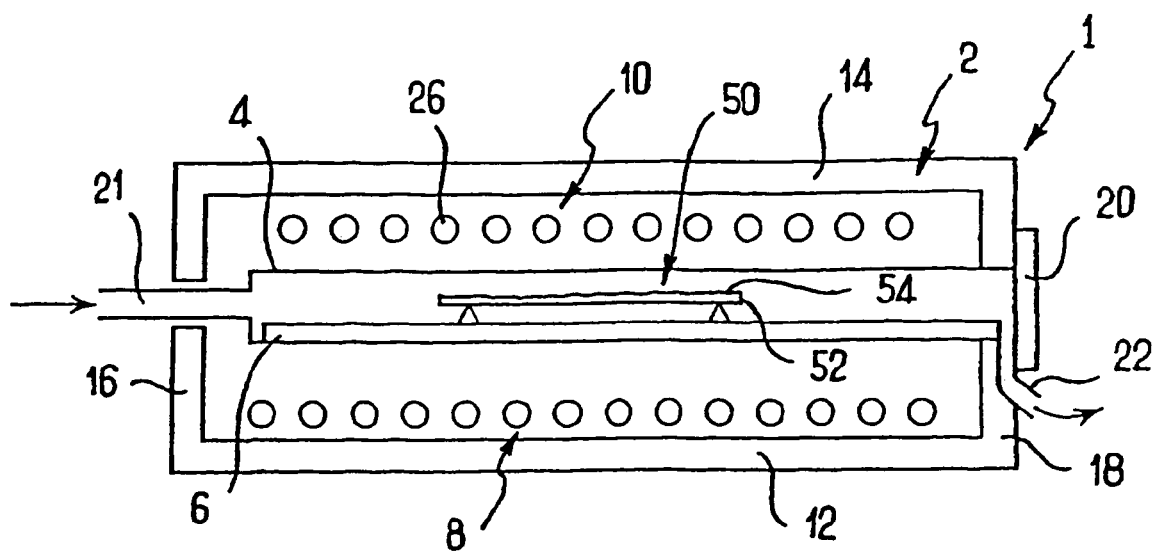
FIG. 1 is an overall, diagrammatic view in longitudinal section of an annealing chamber that enables a process according to the invention to be implemented.

FIG. 1 is a non-limiting example of an annealing chamber 1 that enables the invention to be implemented. The chamber is used to implement an annealing stage under a pure argon atmosphere using the RTA technique.

In this implementation, the chamber 1 includes an enclosure 2, a reactor 4, a substrate-carrier tray 6, two arrays of halogen lamps 8, 10, and two pairs of side lamps. The enclosure 2 also includes a bottom wall 12, a top wall 14, and two side walls 16, 18 situated at respective longitudinal ends of the enclosure 2. One of the side walls 16, 18 includes a gate 20. The reactor 4 includes a quartz tube extending longitudinally between the two side walls 16, 18. A gas inlet 21 and a gas outlet 2 are provided at the respective side walls 16 and 18. The gas outlet 22 is situated in the side wall 18 that has the gate 20. The arrays 8, 10 of halogen lamps are situated above and below the reactor 4, respectively, and between the reactor and the bottom 12 and top 14 walls. Each array 8, 10 of halogen lamps comprises seventeen lamps 26 disposed perpendicular to the longitudinal axis of the reactor 4.

The two pairs of side lamps (not shown in FIG. 1) are situated parallel to the longitudinal axis of the reactor 4, each on one side thereof, generally at the longitudinal ends of the lamps 26 in the arrays 8, 10 of halogen lamps. The substrate-carrying tray 6 slides inside the reactor 4. It supports a wafer 50 that is to be subjected to an annealing stage under a hydrogen-containing atmosphere, and enables wafers to be inserted into and removed from the chamber 1. A chamber 1 of this type is sold by STEAG® under the name "SHS AST 2800".

The "wafer" 50 may be made of, in general, any single-layer or multi-layer structure having a surface layer of semiconductor material (such as silicon, which is preferred but other types of semiconductor material could be used). The present technique can be used to reduce the roughness of the free surface of a wafer 50 that has not been subjected to any prior treatment, and may also be used with wafers that have been obtained by using specific treatments. In particular, different variants of the present method may be applied in particularly advantageous ways to reducing the roughness of the surface of a Silicon-On-Insulator (SOI) structure and/or of a substrate of semiconductor material from which such a structure is obtained, in particular, by applying a method such as the SMART-CUT® type method.

In the context of the SMART-CUT® method, the present method can advantageously be implemented to reduce the roughness of one or the other of the two surfaces of semiconductor material obtained by detaching a wafer along a zone of weakness made during an implantation step, or for reducing the roughness of both surfaces. The different variant implementations of the present method described below by way of example are applied to treating wafers 50 having a useful layer of semiconductor material 52 (e.g. made of silicon), the layer itself having a free surface 54.

The layer 52 is termed "useful" since it is to be used for making electronic, optical, or optoelectronic elements on the wafer 50. As mentioned above, the free surface 54 may be a surface obtained by detaching a wafer from a substrate by implementing a SMART-CUT® method. When the wafer 50 is an SOI substrate obtained by the SMART-CUT® method, the wafer 50 includes a buried oxide layer beneath the useful layer 52 that covers a supporting or stiffening substrate. It should be understood that in FIG. 1 the thickness of the wafer 50 has been exaggerated in order to show the useful layer 52 and its free surface 54.

The present method can be implemented solely by performing an RTA stage on the wafer 50 under an atmosphere of pure argon. The stage of annealing under pure argon comprises the following steps: placing the wafer 50 in the chamber 1, with the chamber being cold when the wafer is inserted; introducing an annealing atmosphere of pure argon into the chamber at a pressure equal to or close to atmospheric pressure (It should also be understood that this pressure could also be set at a lower value, lying in the range a few millitorr (mTorr) to atmospheric pressure); switching on the halogen lamps 26 so as to cause the temperature inside the chamber 1 to rise at a rate of about 50° C. per second, up to a treatment temperature; maintaining the wafer 50 in the chamber 1 throughout the duration of a high-temperature dwell; and switching off the halogen lamps 26 and cooling the wafer 50 by means of a flow of air at a rate of several tens of degrees Celsius per second, with temperature varying in application of any desired relationship.

It is particularly important for the argon to be as pure as possible since it has been found that the presence of small quantities of additional elements (such as oxygen, in particular) can lead to the material of the useful layer being attacked. For example, the material may be attacked by highly volatile SiO if a surface area of silicon is exposed to an annealing atmosphere that includes a small quantity of oxygen. It has been found that such an annealing stage under an atmosphere of pure argon significantly decreases the roughness of the free surface 50. In particular, the results obtained were of much better quality than the reduction in roughness that can be obtained solely by conventional treatment such as a sacrificial oxidation type heat treatment. The uniformity of the useful layer is also superior to that of subjected to a polishing operation.

The RTA stage under pure argon may comprise, for example, a high temperature dwell having a duration of about 1 second to 60 seconds, and in particular from about 5 seconds to 30 seconds, and a treatment temperature lying in the range of about 1000° C. to 1400° C., and in particular between about 1100° C. to 1250° C.

Figure 2:
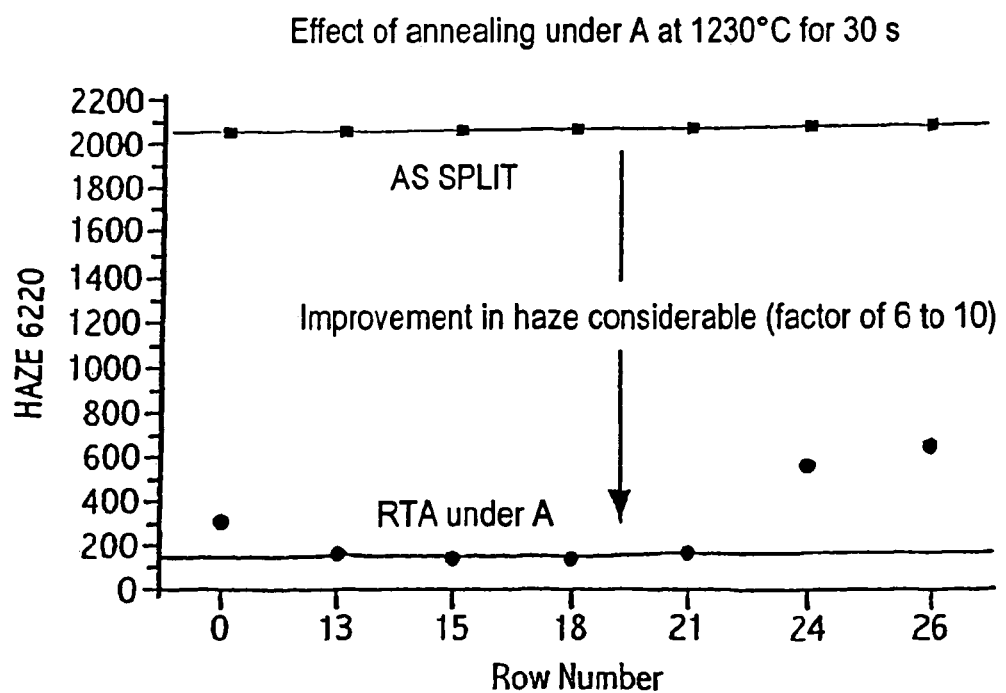
FIG. 2 is a graph showing the reduction in surface roughness obtained by implementing a process according to the invention on a silicon wafer.

FIG. 2 shows the reduction in roughness obtained by such a method. More precisely, this figure sets out the improvement in "haze" obtained by applying the present method as described above. In FIG. 2, the abscissa axis relates to different wafers, with haze being measured for each wafer before applying the annealing stage (top measurement) and after application of the annealing stage (bottom measurement). The top curve thus corresponds to haze as measured at the surface of SOI structures after they have been detached, and the bottom curve relates to the same measurements performed after RTA under argon at 1230° C. with a high temperature dwell of 30 seconds. The term "haze" designates the optical signal diffused by the surface of the substrate 50 in response to excitation by light, and is representative of surface roughness. This characteristic which is representative of the surface roughness of the substrate was measured in the present case using equipment of the KLA TENCOR® type, and of the SURFSCAN 6220® model, and thus the haze as measured is labeled as "HAZE 6220". As shown, the amount of reduction in HAZE 6220 is comparable to the results that can be obtained by other RTA techniques, for example RTA under an atmosphere made of a mixture of hydrogen and argon. More precisely, the improvement in the haze corresponds to haze being cut by a factor of about 6 to 10. Advantageously, implementing the present method makes it possible to obtain results with a high level of quality while avoiding the limitations mentioned above relating to prior RTA techniques. In particular, since argon is an excellent conductor of heat, using an atmosphere of pure argon enables heat to be spread in a manner that is as uniform as possible inside the chamber 1, thereby reducing the slip lines that occur when implementing prior art methods.

As mentioned above, the invention can be implemented solely by using a RTA stage under pure argon, which makes it possible to obtain a considerable improvement in the surface state of the wafer 50. In addition, this improvement is obtained with practically no material being removed from the wafer, but on the contrary with the surface 54 being rebuilt and smoothed.

Several variant implementations of the present method are described below involving not only a RTA stage under pure argon, but also additional treatment stages. In a first variant, the RTA stage using pure argon is followed by a stage of polishing the surface of the wafer 50. This polishing stage may be implemented by using conventional chemical-mechanical polishing. It removes material from the working layer 52 situated close to the free surface 54 that might still contain surface defects.

In a second variant, the RTA stage using pure argon is followed not only by a polishing stage, but also by a subsequent sacrificial oxidation stage combined with heat treatment. The sacrificial oxidation stage reduces any defects that might remain after the preceding stage. When implementing the invention after a SMART-CUT® method, defects may be associated with the implanting stage or the detachment stage. The sacrificial oxidation stage includes an oxidation step and a de-oxidation step. The heat treatment step occurs between the oxidation step and the de-oxidation step. The oxidation step is preferably performed at a temperature lying in the range of about 700° C. to 100° C. The oxidation step may be performed by utilizing a dry technique or by a wet technique. In the dry technique, the oxidation step is performed, for example, by heating the wafer 50 under gaseous oxygen. In the wet technique, the oxidation step is performed, for example, by heating the wafer 50 in an atmosphere charged with steam. In both the dry technique and the wet technique, in conventional methods known to the person skilled in the art, the oxidizing atmosphere may also be charged with hydrochloric acid. The oxidation step leads to an oxide being formed that covers the surface 54 of the useful layer 52.

The heat treatment step may be conducted by using any heat treatment operation serving to improve the qualities of the material of the useful layer 52. The heat treatment step may be performed at constant temperature or by varying the temperature. For example, heat treatment may be performed by progressively raising the temperature between two values, or by controlling the temperature to oscillate cyclically between two values, and the like. The heat treatment step is preferably performed at least in part at a temperature higher than 1000° C., and more particularly around 1100° C. to 1200° C. This heat treatment step is preferably performed under a non-oxidizing atmosphere, which may comprise argon, nitrogen, hydrogen, etc., or indeed a mixture of these gases. The heat treatment may also be performed in a vacuum. Also preferably, the oxidation step is performed prior to the heat treatment step. In this manner, the oxide protects the remainder of the useful layer during the heat treatment step and avoids the phenomenon of pitting. Pitting is a phenomenon that is well known to the skilled person and occurs at the surface of certain semiconductors when they are annealed under a non-oxidizing atmosphere such as nitrogen, argon, in a vacuum, etc. It occurs in particular with silicon when it is bare, i.e. when it is not covered by an oxide layer. In an advantageous variant, the oxidation step begins at the beginning of the rise in temperature of the heat treatment step and it terminates before the end of the heat treatment.

The heat treatment step serves to cure at least in part the defects generated during the preceding stages in the method of fabricating and treating the wafer 50. More particularly, the heat treatment may be performed for a duration and at a temperature to enable it to cure crystal defects, such as stacking defects, "HF" defects, and the like generated in the useful layer 52 during the oxidation step. The term "HF" defect is used to designate any defect whose presence is revealed by a decorative halo in the buried oxide situated under the useful layer 52 (when the wafer 50 is an SOI wafer obtained by a SMART-CUT® method), after the wafer has been treated in a bath of hydrofluoric acid. The heat treatment step also advantageously reinforces the bonding interface between the layer transferred during the transfer of the SMART-CUT® method and the supporting substrate.

The de-oxidation step is preferably performed in a solution. For example, the solution may be a hydrofluoric 10 acid solution at 10% or 20%. A few minutes suffice to remove one thousand to a few thousand angstroms of oxide when the wafer 50 is dipped in such a solution.

In a third variant, the stages of the second variant described above are preceded by an additional sacrificial oxidation stage of the surface of the wafer 50. This additional sacrificial oxidation stage (identical to that described above) preferably is combined with heat treatment. The stages of RTA under pure argon and of chemical-mechanical polishing in this variant are identical to those described for the other variants described above. As for the above-described sacrificial oxidation stage, the first and second sacrificial oxidation stages both comprise an oxidation step and a de-oxidation step. The first and second sacrificial oxidation stages and the heat treatment steps are analogous to those above.

In a fourth variant of the present method, the RTA stage using pure argon is followed by two sacrificial oxidation stages of the free surface of the wafer 50. These sacrificial oxidation stages are identical to those described above and are preferably combined with heat treatment steps as described above. In this variant, an additional chemical-mechanical polishing stage occurs between the two sacrificial oxidation stages.

In a fifth variant of the invention, two stages of RTA under pure argon are performed on the wafer 50, with a chemical-mechanical polishing stage occurring between these two RTA stages.

In a sixth variant of the invention, a sacrificial oxidation stage is performed on the surface of the wafer 50 (which stage is identical to those described above, and is preferably combined with a heat treatment step), after which the wafer 50 is subjected to RTA under an atmosphere of pure argon.

In a seventh variant of the invention, the order of the two main stages of the sixth variant is reversed, with the RTA stage using pure argon being performed before the sacrificial oxidation stage.

In an eighth variant of the invention, between two stages of sacrificial oxidation of the surface of the wafer 50 (which stages are identical with those described above, and preferably combined with heat treatment steps), there is a RTA stage under pure argon.

It should be observed that the different variants of the present method described above all make use of a single annealing operation for smoothing purposes. This single smoothing annealing operation corresponds to rapid thermal annealing under an atmosphere made up solely of pure argon.

Some of the variants may also make use of other types of annealing, but those annealing operations do not smooth the free surface of the wafer. In particular, the heat treatments associated with the sacrificial oxidation operations withdraw material and reinforce the bonding interfaces, and do not smooth the free surface of the wafer.

Although the sacrificial oxidation operations may have an effect on the roughness of the free surface of the wafer, it should be understood that this effect is not in any way comparable to that expected during a "smoothing" operation which seeks, as mentioned above, to reduce the low frequency roughness of the free surface of the wafer in a significant manner. Typically, low frequency roughness of the free surface of a wafer can be reduced by a factor of 1 to 2 by using a sacrificial oxidation technique, whereas when RTA is used the reduction is of the order of a factor of 10 (in this respect reference can be made to the table on page 19 of PCT application WO01/15215).

Moreover, the teaching relating to using heat treatments associated with sacrificial oxidation satisfy a need that is quite different from the goal of smoothing a free surface. In particular, the teaching of U.S. Pat. No. 6,403,450 relating to such heat treatments included in a sacrificial oxidation operation and mentioning the possibility of using an atmosphere of argon is not analogous to the present method wherein an essential element lies in the heat treatment in the RTA stage. Thus, a characteristic, which is essential and common to all of the variants described above, is that only a single smoothing annealing operation is implemented in the form of rapid thermal annealing under an atmosphere made up exclusively of pure argon to reduce free surface roughness.

What is claimed is:

1. A method for reducing roughness on a free surface of a semiconductor wafer which comprises implanting atoms under a face of a donor substrate to form a zone of weakness, bonding a stiffening substrate to the face, detaching the donor substrate along the zone of weakness to form the wafer including the stiffening substrate and a useful layer having the free surface, and applying a rapid thermal annealing process under a pure argon atmosphere for a time sufficient to uniformly heat and smooth the free surface of the wafer.

2. The method of claim 1 which further comprises rapid thermal annealing at a high temperature dwell in the range of about 1000° C. to 1400° C., for a period in the range of about 1 second to 60 seconds.

3. The method of claim 2, wherein the high temperature dwell is in the range of about 1100° C. to 1250° C., for a period in the range of about 5 seconds to 30 seconds.

4. The method of claim 1 which further comprises polishing the free surface of the wafer after the rapid thermal annealing.

5. The method of claim 1 which further comprises implementing at least one sacrificial oxidation stage to reduce slip lines in the free surface of the wafer.

6. A method for reducing roughness on a free surface of a semiconductor wafer which comprises conducting at least one sacrificial oxidation stage on the free surface of the wafer to reduce slip lines therein and applying a rapid thermal annealing process under a pure argon atmosphere for a time sufficient to uniformly heat and smooth the free surface of the wafer; wherein the sacrificial oxidation stage is conducted prior to or after the rapid thermal annealing, or both prior to and after the rapid thermal annealing.

7. The method of claim 6, wherein the sacrificial oxidation stage is conducted after the rapid thermal annealing.

8. The method of claim 6, wherein a first sacrificial oxidation stage is conducted prior to the rapid thermal annealing, and a second sacrificial oxidation stage is conducted after the rapid thermal annealing.

9. The method of claim 8 which further comprises conducting a polishing stage after the rapid thermal annealing and prior to the second sacrificial oxidation stage to further enhance free surface smoothness.

10. The method of claim 6, wherein the rapid thermal annealing is followed by a first sacrificial oxidation stage, a polishing stage and a second sacrificial oxidation stage to further enhance free surface smoothness after the rapid thermal annealing.

11. The method of claim 4 which further comprises another rapid thermal annealing stage under pure argon after polishing to further enhance free surface smoothness.

12. The method of claim 4, which further comprises conducting a first sacrificial oxidation stage prior to the polishing stage.

13. The method of claim 4, which further comprises conducting a second sacrificial oxidation stage after the polishing stage.

14. The method of claim 1 which further comprises forming a silicon-on-insulator structure having a free surface with enhanced smoothness.

15. A method for reducing roughness on a free surface of a semiconductor wafer which comprises:

applying a rapid thermal annealing process under a pure argon atmosphere for a time sufficient to uniformly heat and smooth the free surface of the wafer;

polishing the wafer; and implementing at least one additional treatment step comprising (a) at least one sacrificial oxidation stage conducted prior to or after the rapid thermal annealing process, (b) a sacrificial oxidation stage conducted after polishing, or (c) a second rapid thermal annealing process after polishing to reduce any remaining surface defects and enhance smoothness.

16. The method of claim 15, wherein the sacrificial oxidation stage is conducted after the rapid thermal annealing.

17. The method of claim 15, wherein the sacrificial oxidation stage is conducted prior to the rapid thermal annealing.

18. The method of claim 15, wherein two sacrificial oxidation stages are conducted, including a first sacrificial oxidation stage conducted prior to the rapid thermal annealing and a second sacrificial oxidation stage conducted after the rapid thermal annealing.

19. The method of claim 15, wherein the second rapid thermal annealing process is conducted under pure argon after polishing to further enhance free surface smoothness.

20. The method of claim 15, wherein the sacrificial oxidation stage is conducted after polishing.

21. The method of claim 6, wherein the sacrificial oxidation stage is conducted prior to the rapid thermal annealing.

22. The method of claim 6 which further comprises implanting atoms under a face of a donor substrate to form a zone of weakness, bonding a stiffening substrate to the face, and detaching the donor substrate along the zone of weakness to form the wafer including the stiffening substrate and a useful layer having the free surface.

23. The method of claim 5, wherein the sacrificial oxidation stage is conducted prior to or after the rapid thermal annealing, or both prior to and after the rapid thermal annealing.

24. The method of claim 22, which further comprises conducting a polishing stage after the rapid thermal annealing and prior to a sacrificial oxidation stage to further enhance free surface smoothness.

25. The method of claim 15 which further comprises implanting atoms under a face of a donor substrate to form a zone of weakness, bonding a stiffening substrate to the face, and detaching the donor substrate along the zone of weakness to form the wafer including the stiffening substrate and a useful layer having the free surface.

26. A method for reducing roughness on a free surface of a semiconductor wafer which comprises:

applying a rapid thermal annealing process under a pure argon atmosphere for a time sufficient to uniformly heat and smooth the free surface of the wafer; and implementing at least two additional treatment steps to reduce any remaining surface defects and enhance smoothness, wherein the additional treatment steps include:

(a) a polishing step and at least one sacrificial oxidation stage;

(b) two sacrificial oxidation stages;

(c) a polishing step and another rapid thermal annealing stage; or (d) a sacrificial oxidation stage and another rapid thermal annealing stage.

* * * * *